United States Patent
Yarragunta et al.

(10) Patent No.: US 12,363,820 B2
(45) Date of Patent: Jul. 15, 2025

(54) DATA THROUGHPUT USING A FIN STACK

(71) Applicant: Micron Technology, Inc., Boise, ID (US)

(72) Inventors: Suresh Reddy Yarragunta, Bangalore (IN); Deepu Narasimiah Subhash, Yeshwanthpu (IN)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 18/387,195

(22) Filed: Nov. 6, 2023

(65) Prior Publication Data
US 2024/0172355 A1    May 23, 2024

(30) Foreign Application Priority Data
Nov. 21, 2022 (IN) .............................. 202241066788

(51) Int. Cl.
*G06F 15/16* (2006.01)
*H05K 1/02* (2006.01)
*H05K 3/30* (2006.01)
*G06F 1/20* (2006.01)

(52) U.S. Cl.
CPC .............. *H05K 1/0206* (2013.01); *H05K 3/30* (2013.01); *G06F 1/206* (2013.01)

(58) Field of Classification Search
CPC ......... H05K 1/0206; H05K 3/30; G06F 1/206
USPC ......................................................... 709/200
See application file for complete search history.

(56) References Cited

U.S. PATENT DOCUMENTS

| | | | |
|---|---|---|---|
| 8,150,561 B2* | 4/2012 | Shimotono | G06F 1/206 702/132 |
| 9,913,400 B2* | 3/2018 | Degner | H05K 7/20209 |
| 10,811,336 B2* | 10/2020 | Pillarisetty | H10N 19/00 |
| 11,118,819 B2* | 9/2021 | Yi | G05B 15/02 |
| 11,842,969 B2* | 12/2023 | Blythe | H01L 23/576 |
| 12,167,573 B2* | 12/2024 | He | G06F 1/1635 |
| 12,207,463 B2* | 1/2025 | Byun | G11C 7/04 |
| 12,213,283 B2* | 1/2025 | Yang | H03K 3/017 |
| 2005/0207115 A1 | 9/2005 | Barsun et al. | |
| 2018/0203491 A1 | 7/2018 | Kim | |

(Continued)

FOREIGN PATENT DOCUMENTS

JP    2005174203    6/2005

OTHER PUBLICATIONS

"International Application Serial No. PCT US2023 080287, International Search Report mailed Mar. 15, 2024", 3 pages.

(Continued)

*Primary Examiner* — Moustafa M Meky
(74) *Attorney, Agent, or Firm* — Schwegman Lundberg & Woessner, P.A.

(57) ABSTRACT

Aspects of the present disclosure configure a memory subsystem processor to use a fin stack to improve heat dissipation to improve a data transfer rate. The processor measures temperature of at least one of the processing device or the set of memory components. The processor accesses a reference temperature for controlling data transfer rate between a host and the set of memory components. The processor compares the measured temperature with the reference temperature and, based on the comparison, adjusts the data transfer rate based on comparing the measured temperature with the reference temperature.

20 Claims, 6 Drawing Sheets

(56) References Cited

U.S. PATENT DOCUMENTS

| | | |
|---|---|---|
| 2019/0067156 A1 | 2/2019 | Kim et al. |
| 2019/0249908 A1* | 8/2019 | Yi .......................... A63F 13/24 |
| 2021/0116142 A1* | 4/2021 | Boucher ................. G06N 3/04 |
| 2021/0318822 A1 | 10/2021 | Sloat |
| 2022/0238541 A1* | 7/2022 | Byun ..................... H10N 19/00 |
| 2023/0358447 A1* | 11/2023 | Yi .......................... G06F 3/011 |
| 2024/0111343 A1* | 4/2024 | Pratapgarhwala .... G06F 9/4893 |
| 2024/0142942 A1* | 5/2024 | North ..................... G06F 1/203 |

OTHER PUBLICATIONS

"International Application Serial No. PCT US2023 080287, Written Opinion mailed Mar. 15, 2024", 5 pages.

* cited by examiner

DATA THROUGHPUT USING A FIN STACK

PRIORITY APPLICATION

This application claims the benefit of priority to Indian Patent Application Serial Number 202241066788, filed Nov. 21, 2022, which is incorporated herein by reference in its entirety.

TECHNICAL FIELD

Embodiments of the disclosure relate generally to memory sub-systems and, more specifically, to providing heat management and dissipation.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
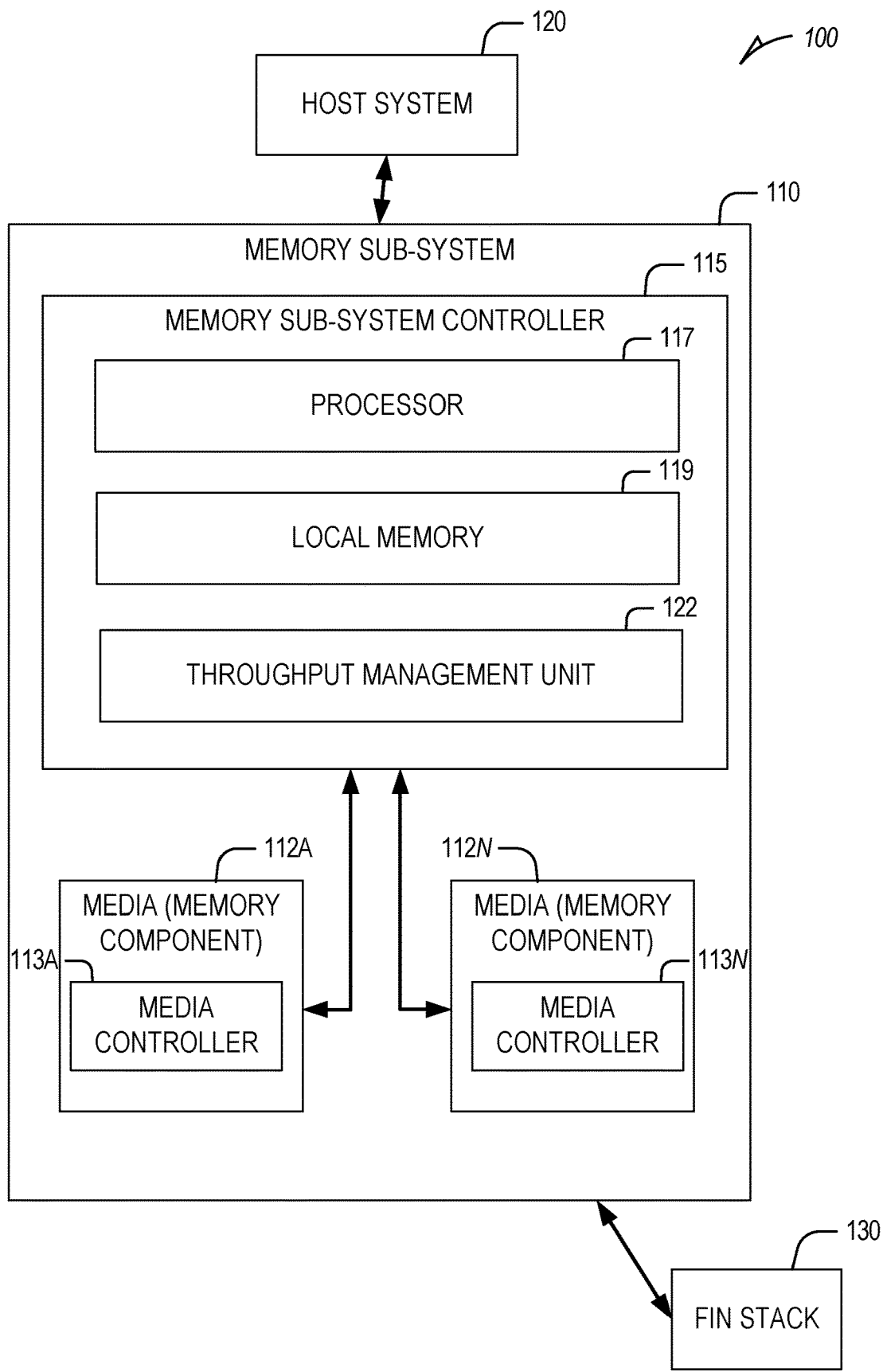
FIG. 1 is a block diagram illustrating an example computing environment including a memory sub-system, in accordance with some embodiments of the present disclosure.

Aspects of the present disclosure configure a system component, such as a memory sub-system processor or controller, such as a power management unit or module, to control data throughput (e.g., transfer between memory components and a host) based on heat that is dissipated through a fin stack. In response to detecting that the temperature of the processor or the memory transgresses a threshold or reference temperature, the memory sub-system processor or controller adjusts (e.g., throttles or reduces) the data throughput (the rate at which data is exchanged with a host or is transmitted from the processor to an external component) to reduce the temperature. When the temperature no longer transgresses the threshold or reference temperature, the processor or controller increases the data throughput. The temperature can be controlled (minimized or reduced) to prolong when the data throughput will be throttled or adjusted using one or more fin stacks that is/are physically coupled to one of the memory sub-system components, such as the memory controller, memory components, and/or memory cells. The fin stacks can be coupled through a ground plane of a printed circuit board (PCB) and are configured to dissipate heat similar to a heat sink. This ensures that performance of the memory system remains optimal and avoids drastic data throughput throttling or reduction with minimal hardware additions. This improves the overall efficiency of operating and implementing the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data."

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data." "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scan reads all data and identifies the error status of all blocks as a background operation. If a certain threshold of errors per block or ECC unit is exceeded in this scan-read, a refresh operation is triggered.

A memory device can be a non-volatile memory device. A non-volatile memory device is a package of one or more dice (or dies). Each die can be comprised of one or more planes. For some types of non-volatile memory devices (e.g., NAND devices), each plane is comprised of a set of physical blocks. For some memory devices, blocks are the smallest area than can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are raw memory devices combined with a local embedded controller for memory management within the same memory device package.

There are challenges in efficiently managing or performing media management operations on typical memory devices in case of high temperature of the memory device and/or memory controller. Specifically, typical memory subsystems are implemented on a PCB and distribute the components on the PCB in a way that minimizes heat build-up on certain components. Sometimes, specialized hardware, such as heat sinks, can be used that are physically attached to corresponding components to improve heat dissipation and cooling of the components. When the memory device/controller gets too hot (e.g., reaches a temperature that transgresses a threshold temperature), typical devices begin throttling or reducing the data throughput and can slow down certain operations in an attempt to lower the operating temperature. While these systems and approaches generally work well, the need to add these large heat sinks to reduce power can consume a great deal of physical real estate on the printed circuit boards (PCBs) and can exceed the maximum allowable height that components on the PCB are allowed to reach. As a result, fewer memory components can be added and heat sinks cannot always be included which causes the components to reach the threshold temperature very quickly, which reduces the overall data throughput and speed at which the memory sub-systems can operate.

Aspects of the present disclosure address the above and other deficiencies by providing a fin stack that is thermally coupled electrically to one or more memory components, such as a memory processor and/or memory dies or cells, which can improve heat dissipation and act as a heat sink while not violating any specifications, such as maximum height or PCB space restrictions. The fin stack can collect heat dissipated by the memory components by being coupled via a ground layer of the PCB and transferring the heat to the air. In some examples, the fin stack includes a collection of multiple conductors that extend beyond a surface or top plane of the PCB up to a height defined or limited in a specification or design. The conductors can be bent at a particular point at the height to provide a flat surface over which a metal layer is placed to further improve heat dissipation. This provides a heat sink for the various components on the PCB without having to directly place the heat sink on top of individual components which may violate certain specifications and restrictions. In this way, the operating temperature of the memory system can be maintained at a relative lower level (e.g., below the threshold temperature) for longer periods of time than typical systems which can prolong, delay or prevent throttling of the data throughput and reduction in performance of the memory systems. This increases the efficiency of operating memory systems and can reduce the amount of physical resources consumed by the memory sub-systems.

In some examples, the memory controller (or throughput management unit) accesses a reference temperature for controlling data transfer throughput (e.g., data transfer rate) between a host and the set of memory components). The controller measures temperature of at least one of the processing device or the set of memory components. Heat associated with the at least one of the processing device or the set of memory components can be dissipated at least in part through the fin stack. The controller adjusts (e.g., increases or reduces) the data transfer throughput (e.g., the data transfer rate) based on comparing the measured temperature with the reference temperature.

In some examples, a PCB is provided on which the set of memory components, the processing device, and the fin stack are implemented. In some aspects, the PCB includes a plurality of layers each accessible through one or more vias, the plurality of layers including a ground layer. The set of memory components and the processing device are both coupled to the fin stack through the ground layer.

In some examples, the fin stack is coupled to the ground layer through the one or more vias, such as thermal vias or holes drilled into the PCB. In some aspects, the processing device is implemented by a physical chip having a specified height relative to a top layer of the PCB. A height of the fin stack can be less than or equal to the specified height of the physical chip. In some examples, the set of memory components is implemented by a physical chip having a specified height relative to a top layer of the PCB. A height of the fin stack can be less than or equal to the specified height of the physical chip. In some examples, the specified height includes 1.5 millimeters or less.

In some examples, the PCB includes an M.2 interface through which the set of memory components and the processing device communicate with a host. The fin stack can be implemented on the PCB on an opposite end of the M.2 interface. In some aspects, the fin stack includes a heat sink. In some examples, the fin stack is disposed on the PCB in a region between the processing device and the set of memory components. In some aspects, the fin stack includes a plurality of metal conductors, each of the plurality of metal conductors being coupled via a ground layer to the at least one of the processing device or the set of memory components.

In some examples, each of the plurality of metal conductors extends vertically to a specified height relative to a base of a printed circuit board (PCB) on which the processing device and the set of memory components are implemented. In some examples, each of the plurality of metal conductors extends horizontally a specified distance from the specified height parallel to the PCB.

In some examples, the fin stack includes a metal layer that is coupled to and covers each of the plurality of metal conductors at the specified height.

In some examples, a method of manufacturing the PCB including a memory system is provided. The method includes placing a processing device on a first portion of the PCB. The method includes placing a set of memory components of the memory system on a second portion of the PCB. The method includes connecting a fin stack placed on a third portion of the PCB to a ground layer of the PCB. The method includes coupling the processing device and the set of memory components through the ground layer of the PCB to the fin stack.

In some examples, the method includes placing a conductor of the fin stack in a via of the PCB. The method includes bending a top portion of the conductor that extends vertically a specified distance from a base of the PCB.

Though various embodiments are described herein as being implemented with respect to a memory sub-system (e.g., a controller of the memory sub-system), some or all of the portions of an embodiment can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies). These individual dies can be coupled to each other on an integrated circuit and placed as separate or combined components on a PCB.

In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-systems 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, an M.2 SSD interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface and/or M.2 SSD interface. The physical host interface can provide an interface for passing control, address, data, and other signals between the memory sub-system 110 and the host system 120. The memory sub-system 110 can be implemented on a PCB that is coupled to the host system 120 via a specified interface, such as the M.2 SSD interface.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random-access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells.

A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data.

The memory sub-system controller 115 can communicate with the memory components 112A to 112N to perform memory operations such as reading data, writing data, or erasing data at the memory components 112A to 112N and other such operations. The memory sub-system controller 115 can communicate with the memory components 112A to 112N to perform various memory management operations, such as different scan rates, different scan frequencies, different wear leveling, different read disturb management, different near miss ECC operations, and/or different dynamic data refresh.

The memory sub-system controller 115 can include hardware such as one or more integrated circuits and/or discrete components, a throughput management unit 122, a fin stack 130, a buffer memory, and/or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode with instructions for the memory sub-system controller 115 to execute, such as firmware. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. The memory sub-system controller 115 can be responsible for other memory management operations, such as wear leveling operations, garbage collection operations, error detection and error-correcting code (ECC) operations, encryption operations, caching operations, memory components 112A to 112N initialization, and/or address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120. The memory sub-system controller 115 can include a memory interface to communicate with the memory components 112A to 112N. Any component included as part of the memory sub-system controller 115 can be included in the memory interface and vice versa.

The memory sub-system 110 can also include additional circuitry or components that are not illustrated, such as capacitors, resistors, transistors, and various other active or passive devices. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which are raw memory devices combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

The memory sub-system controller 115 can include a throughput management unit 122 that is coupled to a fin stack 130. In some cases, the throughput management unit 122 can be a separate physical component from the components of the memory sub-system controller 115. In some cases, the throughput management unit 122 and the components of the memory sub-system controller 115 are implemented by the same physical device or integrated circuit. The fin stack 130 is a separate physical device from the throughput management unit 122 and/or the memory sub-system controller 115. The fin stack 130 implements a heat sink (which can be an active or passive heatsink) that is configured to draw or receive heat from one of the components of the memory sub-system 110 and dissipate such heat to the air or other fluid or gas to cool components of the memory sub-system 110.

In one example, the fin stack 130 can be implemented using a plurality of conductors or conductive elements coupled to a ground layer of a PCB on which the memory sub-system 110 is implemented. Heat can be transferred via the ground layer to the fin stack 130 and dissipated to the external fluid or gas. In this way, the fin stack 130 acts as a remote heat sink and temperature of the memory sub-system 110 can be reduced or maintained at a relatively low level to prevent the throughput management unit 122 from reducing throughput of the memory sub-system 110 in response to detecting that the temperature of one or more components of the memory sub-system 110 transgresses a temperature threshold or reference temperature. This keeps the data rate operating at the optimal or maximum level which improves the overall efficiency and functioning of the device. In some examples, the fin stack 130 can collect heat dissipated by one or more components of the memory sub-system controller 115 and/or the memory sub-system 110, such as the memory components 112A to 112N, and can convert the dissipated heat it collects into electrical energy or power to return the power back to one or more devices or components. This increases the efficiency of operating memory systems and reduces the amount of physical resources consumed by the memory sub-systems.

Depending on the embodiment, the throughput management unit 122 can comprise logic (e.g., a set of transitory or non-transitory machine instructions, such as firmware) or one or more components that causes the throughput management unit 122 to perform operations described herein. The throughput management unit 122 can comprise a tangible or non-tangible unit capable of performing operations described herein.

For example, the throughput management unit 122 can be configured to accesses a reference temperature for controlling data transfer throughput (data transfer rate between a host and the memory sub-system). The throughput management unit 122 measures temperature of at least one of the processing device or the set of memory components. Heat associated with the at least one of the components of the memory sub-system 110 can be dissipated at least in part through the fin stack 130 that is thermally coupled to the processing device and the set of memory components. The throughput management unit 122 adjusts or reduces the data transfer throughput in response to determining that the measured temperature transgresses the reference temperature. The throughput management unit 122 adjusts or increases the data transfer throughput in response to determining that the measured temperature no longer or fails to transgress the reference temperature.

In some examples, a PCB is provided on which the set of memory components, the processing device, and the fin stack 130 (and various other components of the memory sub-system 110) are implemented. In some examples, the PCB includes a plurality of layers each accessible through one or more vias, the plurality of layers including a ground layer. The set of memory components and the processing device are both coupled to the fin stack 130 through the ground layer.

In some examples, the fin stack 130 is coupled to the ground layer through the one or more vias, such as thermal vias or holes drilled into the PCB. In some aspects, the throughput management unit 122 is implemented by a physical chip having a specified height relative to a top layer of the PCB. A height of the fin stack 130 can be less than or equal to the specified height of the physical chip. In some examples, the set of memory components is implemented by a physical chip having a specified height relative to a top layer of the PCB. A height of the fin stack 130 can be less than or equal to the specified height of the physical chip. In some examples, the specified height includes 1.5 millimeters or less.

In some examples, the PCB includes an M.2 interface through which the set of memory components and the throughput management unit 122 communicate with the host system 120. The fin stack 130 can be implemented on the PCB on an opposite end of the M.2 interface. In some examples, the fin stack 130 includes a heat sink. In some examples, the fin stack 130 is disposed on the PCB in a region between the processing device and the set of memory components. In some aspects, the fin stack 130 includes a plurality of metal conductors, each of the plurality of metal conductors being coupled via a ground layer to the at least one of the processing device or the set of memory components. In some examples, each of the plurality of metal conductors extends vertically to a specified height relative to a base of the PCB. In some examples, each of the plurality of metal conductors extends horizontally a specified distance from the specified height parallel to the PCB.

In some examples, the fin stack 130 includes a metal layer that is coupled to and covers each of the plurality of metal conductors at the specified height.

Figure 2:
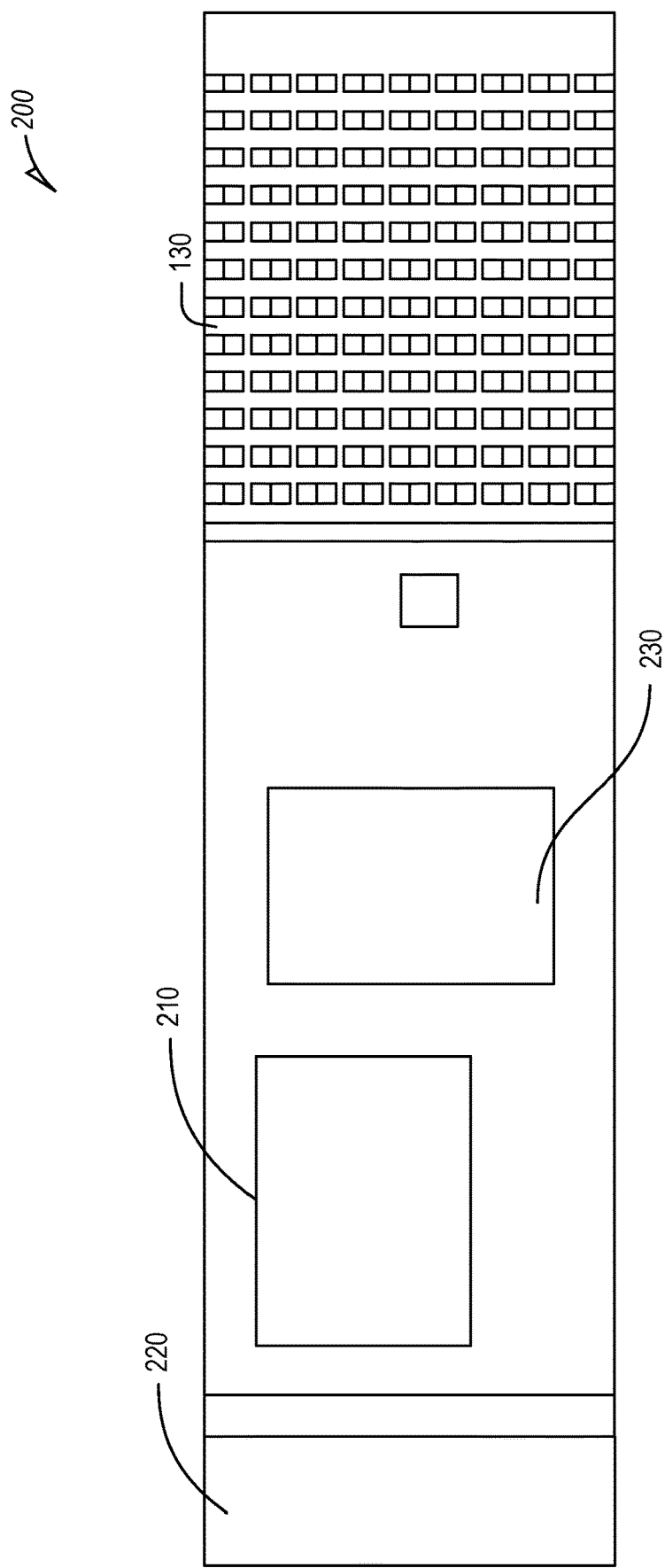
FIG. 2 is a diagram of an example physical assembly of the memory sub-system with a fin stack, in accordance with some implementations of the present disclosure.

FIG. 2 is a diagram 200 of an example physical assembly or PCB on which the memory sub-system 110 and the fin stack 130 are implemented, in accordance with some implementations of the present disclosure. The PCB shown in the diagram 200 includes an interface 220 (e.g., an M.2 interface), a control component 210, a memory component 230, and the fin stack 130.

The control component 210 can include a physical chip or integrated circuit package in which any one of the components of the memory sub-system 110 can be implemented, such as the memory sub-system controller 115. The memory component 230 can include one or more physical chips or integrated circuit packages in which any one of the memory components 112 is implemented. The memory sub-system 110 communicates with the host system 120 via the interface 220. In some cases, the memory sub-system 110 communicates with the host system 120 at a first throughput or data rate. When the throughput management unit 122 determines that a temperature of the control component 210 and/or the memory component 230 reaches or transgresses a temperature threshold or reference temperature, the throughput management unit 122 can throttle or reduce the data rate so that the memory sub-system 110 communicates with the host system 120 at a second throughput or data transfer rate. This allows the throughput management unit 122 to reduce the operating temperature of the memory sub-system 110 to continue operating without having to shut down any component.

In order to increase the amount of time it takes the memory sub-system 110 to reach the temperature threshold or reference temperature from an ambient temperature, the PCB includes the fin stack 130. The fin stack 130 is thermally coupled physically via a ground layer or other internal metal layer of the PCB to one or more of the control component 210, memory component 230 and/or the interface 220. As shown in more detail in connection with FIG. 3, the fin stack 130 includes a plurality of individual conductors that protrude or extend away from a surface of the PCB. The individual conductors receive heat dissipated by the one or more of the control component 210, memory component 230 and/or the interface 220 through the ground layer or other metal layer of the PCB. The individual conductors can then dissipate that heat to a fluid or gas external to the PCB which cools down the one or more of the control component 210, memory component 230 and/or the interface 220.

In some examples, a top portion of each of the metal conductors of the fin stack 130 is bent, such as 90 degrees. This creates a flat surface on top of which an additional metal or non-metal layer or component can be placed. The metal or non-metal layer can be placed to cover and connect to each of the metal conductors of the fin stack 130 to help distribute, dispense and evenly spread the heat dissipated and received by each of the conductors.

In some examples, the interface 220 is associated with a height restriction. The height restriction limits the total height (e.g., vertical distance between a surface of the PCB and a top portion of any component placed on the PCB). In such cases, the distance or vertical displacement between the surface of the PCB and the top portion of each metal conductor (including the top metal layer placed on the metal conductors of the fin stack 130) is set to not exceed the total height of the height restriction. While the diagram 200 illustrates the fin stack 130 as being placed on an opposite end of the PCB from the interface 220, the fin stack 130 can be distributed throughout the PCB on various empty portions, such as between the control component 210 and the memory component 230.

Figure 3:
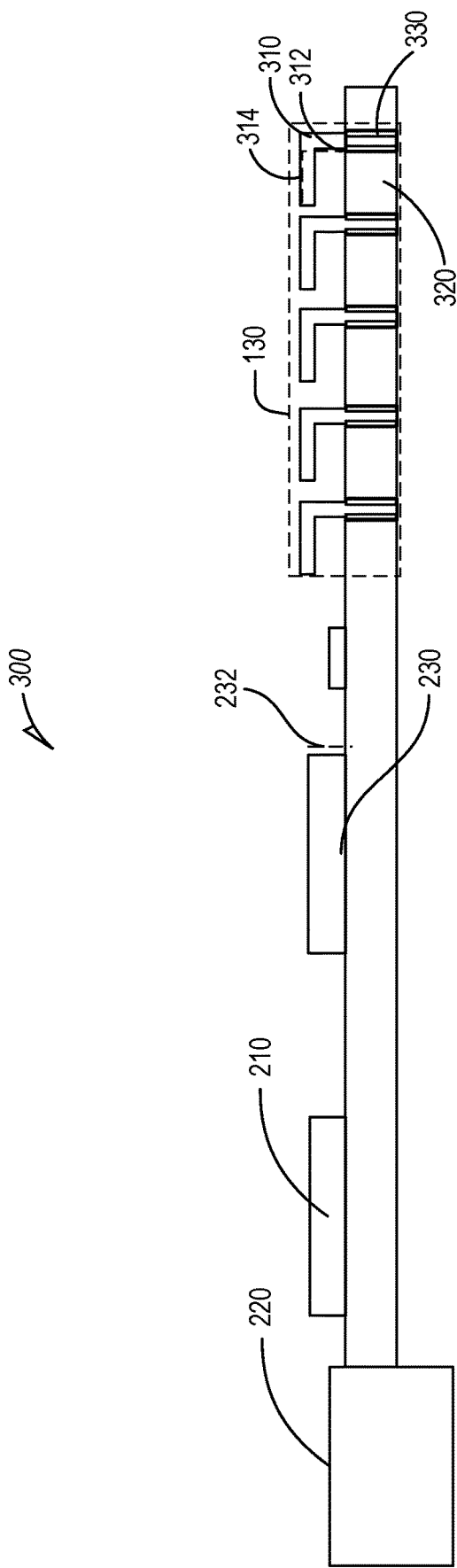
FIG. 3 is a block diagram of an example physical assembly of the memory controller with the fin stack, in accordance with some implementations of the present disclosure.

FIG. 3 is a block diagram of an example physical assembly 300 of the memory controller with the fin stack, in accordance with some implementations of the present disclosure. FIG. 3 shows a cross-sectional view or perspective of PCB shown in the diagram 200 which shows a top down view of the PCB on which the fin stack 130 is implemented. Components from FIG. 2 are similarly labeled in FIG. 3.

As shown in FIG. 3, the interface 220 can be associated with a height restriction. The height restriction can specify a maximum height 232 which any individual component placed on the PCB can have. For example, the memory component 230 can be implemented by a physical chip having a height measured from a surface of the PCB to a top of the physical chip that is less than or equal to the maximum height 232.

The fin stack 130 includes a plurality of conductors 310. Each conductor 310 includes a portion that is inserted and extends through the PCB, such as through a thermal via 330, to a ground layer 320 or other metal layer or bottom layer of the PCB. Each conductor 310 can be identical in height or can be varied in height. In some examples, an individual conductor 310 can protrude or extend vertically away from and relative to the surface of the PCB to the maximum height 232. Namely, the distance between where the individual conductor 310 exits the PCB and the topmost portion of the conductor 310 is no larger than the maximum height 232. At that point, in order to allow for additional metal layers to be added on top of one or more of the conductors 310, the conductor 310 is bent 90 degrees. This creates a portion of the conductor 310 that runs parallel to the surface of the PCB and a portion of the conductor 310 that runs orthogonal to the surface of the PCB. The portion that runs parallel to the surface of the PCB begins at the maximum height 232 or at some other height lower than the maximum height 232.

Each of the conductors 310 can be bent 90 degrees at the same point or level and in the same direction as each other. In some cases, a first portion of the conductors 310 are bent 90 degrees in a first direction and a second portion of the conductors 310 are bent 90 degrees in a second direction. The second direction can be 180 degrees from the first direction, 90 degrees relative to the first direction or any number of degrees different from the first direction. This results in a flat surface 314 on top of which a metal layer or non-metal layer can be placed.

In this way, heat can be collected or transferred from the interface 220, control component 210, and/or the maximum height 232 through the ground layer or other dedicated or non-dedicated metal layer to the fin stack 130. The heat is then dissipated to a fluid or gas that touches the ends of the conductors 310 and portions of the conductors 310 that extend out of the surface of the PCB.

Figure 4A:
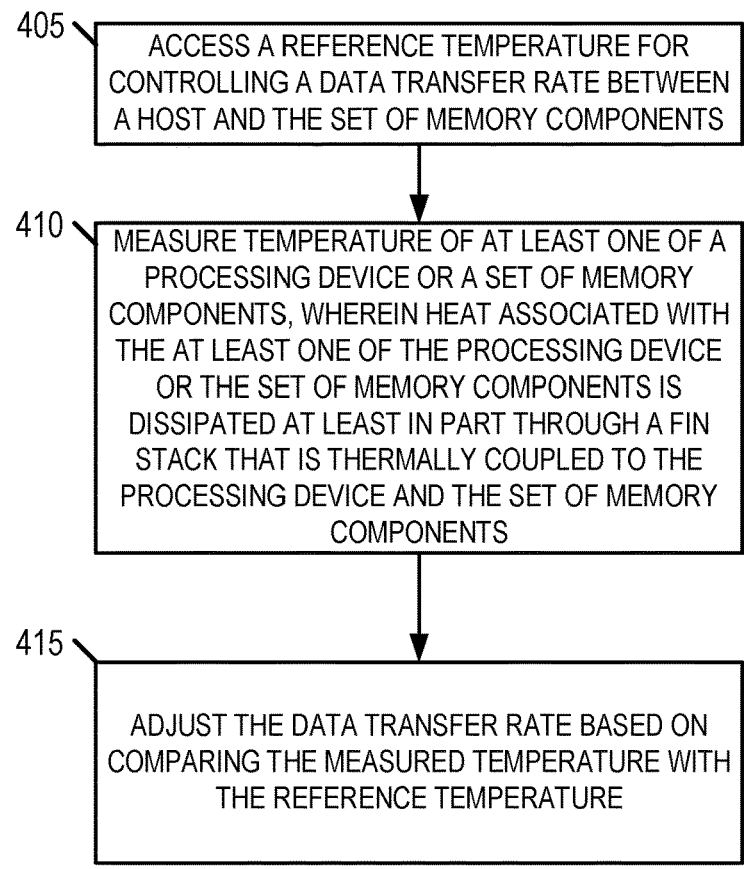
FIG. 4A is a flow diagram of an example method to perform data throughput management and heat dissipation, in accordance with some implementations of the present disclosure.

FIG. 4A is a flow diagram of an example method to perform data throughput management and heat dissipation, in accordance with some implementations of the present disclosure. The method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 400 is performed by the throughput management unit 122 of FIG. 1. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to FIG. 4A, the method (or process) 400 begins at operation 405, with a throughput management unit 122 of a memory sub-system (e.g., memory sub-system 110) accessing a reference temperature for controlling a data transfer rate between a host and the set of memory components. Then, the throughput management unit 122 measures a temperature of at least one of a processing device (e.g., memory sub-system controller 115) or a set of memory components 112 at operation 410. In an example, heat associated with at least one of a processing device (e.g., memory sub-system controller 115) or the set of memory components 112 is dissipated at least in part through a fin stack 130 that is thermally coupled to the at least one of a processing device (e.g., memory sub-system controller 115) or a set of memory components 112. At operation 415, the throughput management unit 122 adjusts the data transfer rate based on comparing the measured temperature with the reference temperature (e.g., reduces the data transfer rate in response to determining that the temperature transgresses (exceeds by more than a specified amount) the reference temperature).

Figure 4B:
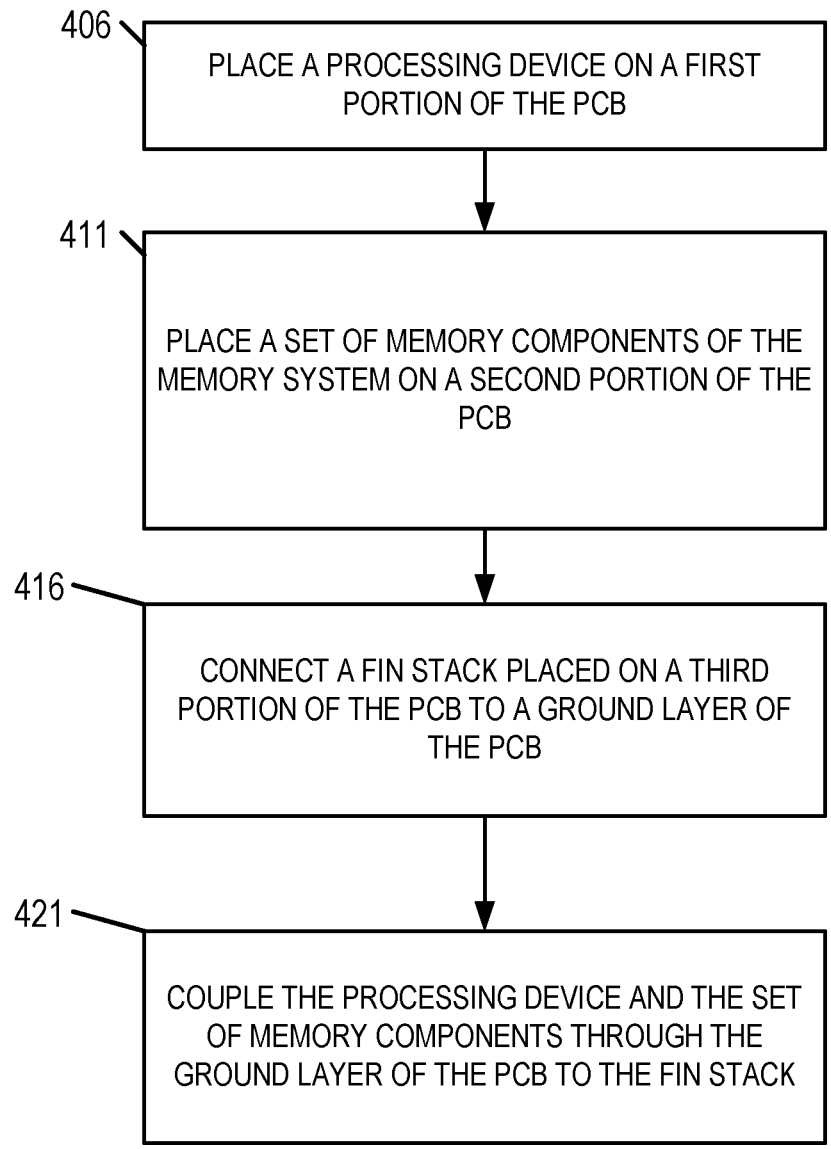
FIG. 4B is a flow diagram of an example method to manufacture a physical assembly of the memory sub-system with a fin stack, in accordance with some implementations of the present disclosure.

FIG. 4B is a flow diagram of an example method to manufacture a physical assembly of the memory sub-system with a fin stack, in accordance with some implementations of the present disclosure. The method 401 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to FIG. 4B, the method (or process) 401 begins at operation 406, with a processing device being placed on a first portion of a PCB and, at operation 411, a set of memory components 112 being placed on a second portion of the PCB. Then, a fin stack 130 that is placed on a third portion of the PCB is connected to a ground layer of the PCB at operation 416. At operation 421, the processing device and the set of memory components are coupled through the ground layer of the PCB to the fin stack 130.

In view of the disclosure above, various examples are set forth below. It should be noted that one or more features of an example, taken in isolation or combination, should be considered within the disclosure of this application.

Example 1. A system comprising: a set of memory components of a memory sub-system; a processing device; a fin stack thermally coupled to the set of memory components and the processing device, the fin stack configured to dissipate heat from the processing device and the set of memory components, wherein the processing device is configured to perform operations comprising: measuring temperature of at least one of the processing device or the set of memory components; accessing a reference temperature for controlling data transfer rate between a host and the set of memory components; comparing the measured temperature with the reference temperature; and adjusting the data transfer rate based on comparing the measured temperature with the reference temperature.

Example 2. The system of clause 1, comprising a printed circuit board (PCB) on which the set of memory components, the processing device, and the fin stack are implemented.

Example 3. The system of Example 2, wherein the PCB includes a plurality of layers each accessible through one or more vias, the plurality of layers comprising a ground layer, and wherein the set of memory components and the processing device are both coupled to the fin stack through the ground layer.

Example 4. The system of Example 3, wherein the fin stack is coupled to the ground layer through the one or more vias.

Example 5. The system of any one of Examples 1-4, wherein the processing device is implemented by a physical chip having a specified height relative to a top layer of the PCB, and wherein a height of the fin stack is less than or equal to the specified height of the physical chip.

Example 6. The system of any one of Examples 1-5, wherein the set of memory components is implemented by a physical chip having a specified height relative to a top layer of the PCB, and wherein a height of the fin stack is less than or equal to the specified height of the physical chip.

Example 7. The system of Example 6, wherein the specified height comprises 1.5 millimeters.

Example 8. The system of any one of Examples 1-7, wherein the PCB comprises an M.2 interface through which the set of memory components and the processing device communicate with a host, the fin stack being implemented on the PCB on an opposite end of the M.2 interface.

Example 9. The system of any one of Examples 1-8, wherein the fin stack comprises a heat sink.

Example 10. The system of any one of Examples 1-9, wherein the fin stack comprises a plurality of metal conductors, each of the plurality of metal conductors being coupled via a ground layer to the at least one of the processing device or the set of memory components.

Example 11. The system of Example 10, wherein each of the plurality of metal conductors extends vertically to a specified height relative to a base of a printed circuit board (PCB) on which the processing device and the set of memory components are implemented.

Example 12. The system of Example 11, wherein each of the plurality of metal conductors extends horizontally a specified distance from the specified height parallel to the PCB.

Example 13. The system of any one of Examples 1-12, wherein the fin stack is disposed on the PCB in a region between the processing device and the set of memory components.

Example 14. The system of any one of Examples 1-13, wherein the fin stack comprises a metal layer that is coupled to and covers each of the plurality of metal conductors at the specified height.

Example 15. A method of manufacturing a printed circuit board (PCB) comprising a memory system, the method comprising: placing a processing device on a first portion of the PCB; placing a set of memory components of the memory system on a second portion of the PCB; connecting a fin stack placed on a third portion of the PCB to a ground layer of the PCB, the fin stack configured to dissipate heat from the processing device and the set of memory components; and coupling the processing device and the set of memory components through the ground layer of the PCB to the fin stack.

Example 16. A method or system according to any of the above Examples, comprising: placing a conductor of the fin stack in a via of the PCB; and bending a top portion of the conductor that extends vertically a specified distance from a base of the PCB.

Methods and computer-readable storage medium with instructions for performing any one of the above examples.

Figure 5:
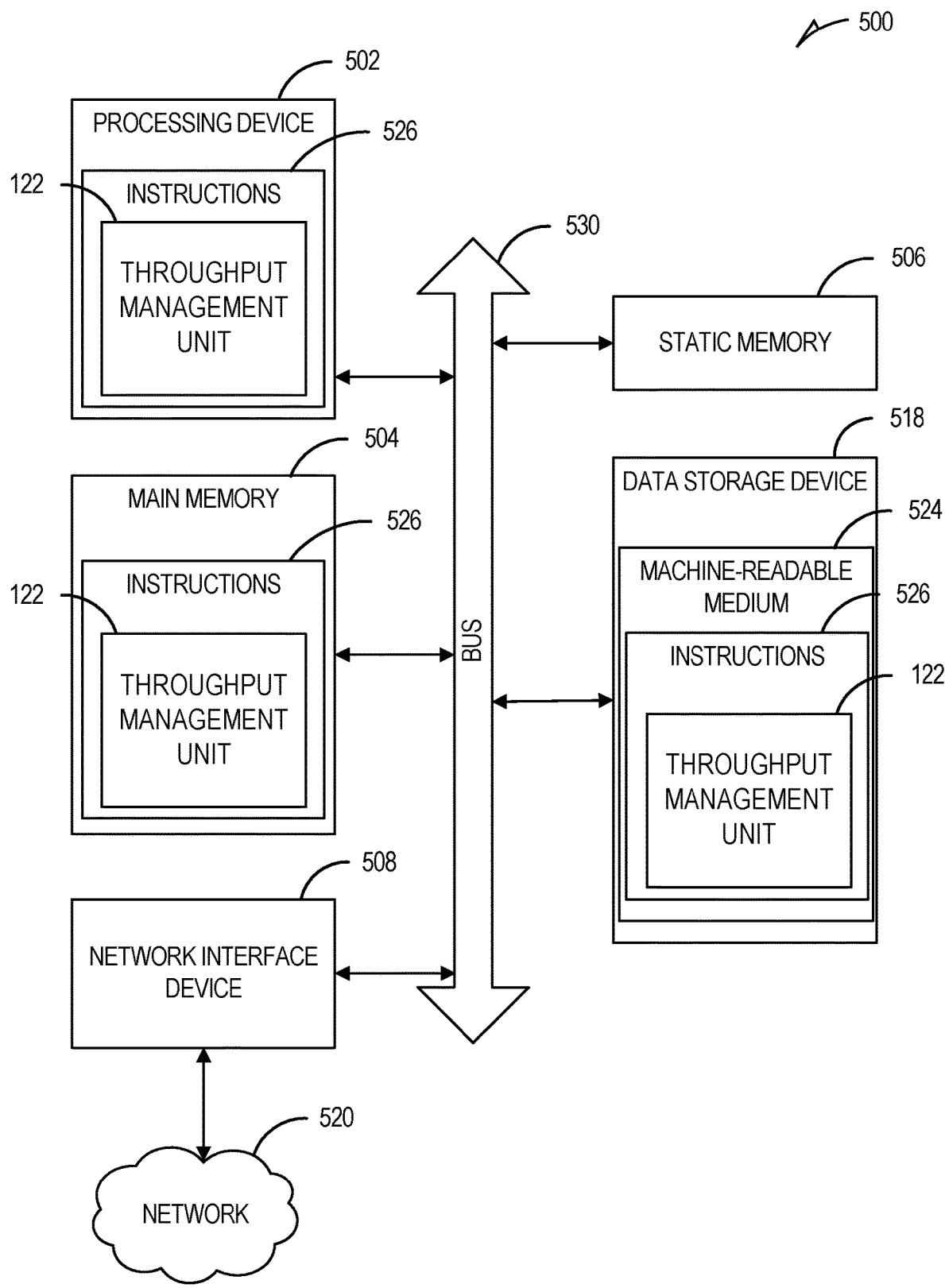
FIG. 5 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 5 illustrates an example machine in the form of a computer system 500 within which a set of instructions can be executed for causing the machine to perform any one or more of the methodologies discussed herein. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the throughput management unit 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device 502 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), a network processor, or the like. The processing device 502 is configured to execute instructions 526 for performing the operations and steps discussed herein. The computer system 500 can further include a network interface device 508 to communicate over a network 520.

The data storage device 518 can include a machine-readable storage medium 524 (also known as a computer-readable medium) on which is stored one or more sets of instructions 526, or software embodying any one or more of the methodologies or functions described herein. The instructions 526 can also reside, completely or partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 implement functionality corresponding to the throughput management unit 122 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a method according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a set of memory components of a memory sub-system;
    a processing device operatively coupled to the fin stack and the set of memory components; and
    a fin stack thermally coupled to the set of memory components and the processing device, the fin stack configured to dissipate heat from the processing device and the set of memory components, wherein the processing device is configured to perform operations comprising:
        measuring temperature of at least one of the processing device or the set of memory components;
        accessing a reference temperature for controlling data transfer rate between a host and the set of memory components;
        comparing the measured temperature with the reference temperature; and
        adjusting the data transfer rate based on comparing the measured temperature with the reference temperature.

2. The system of claim 1, comprising a printed circuit board (PCB) on which the set of memory components, the processing device, and the fin stack are implemented.

3. The system of claim 2, wherein the PCB includes a plurality of layers each accessible through one or more vias, the plurality of layers comprising a ground layer, and wherein the set of memory components and the processing device are both coupled to the fin stack through the ground layer.

4. The system of claim 3, wherein the fin stack is coupled to the ground layer through the one or more vias.

5. The system of claim 2, wherein the processing device is implemented by a physical chip having a specified height relative to a top layer of the PCB, and wherein a height of the fin stack is less than or equal to the specified height of the physical chip.

6. The system of claim 2, wherein the set of memory components is implemented by a physical chip having a specified height relative to a top layer of the PCB, and wherein a height of the fin stack is less than or equal to the specified height of the physical chip.

7. The system of claim 6, wherein the specified height comprises 1.5 millimeters.

8. The system of claim 1, wherein a PCB comprises an M.2 interface through which the set of memory components and the processing device communicate with a host, the fin stack being implemented on the PCB on an opposite end of the M.2 interface.

9. The system of claim 1, wherein the fin stack comprises a heat sink.

10. The system of claim 1, wherein the fin stack comprises a plurality of metal conductors, each of the plurality of metal conductors being coupled via a ground layer to the at least one of the processing device or the set of memory components.

11. The system of claim 10, wherein each of the plurality of metal conductors extends vertically to a specified height relative to a base of a printed circuit board (PCB) on which the processing device and the set of memory components are implemented.

12. The system of claim 11, wherein each of the plurality of metal conductors extends horizontally a specified distance from the specified height parallel to the PCB.

13. The system of claim 11, wherein the fin stack is disposed on the PCB in a region between the processing device and the set of memory components.

14. The system of claim 11, wherein the fin stack comprises a metal layer that is coupled to and covers each of the plurality of metal conductors at the specified height.

15. A method comprising:
- measuring temperature of at least one of a processing device or a set of memory components, wherein heat associated with the at least one of the processing device or the set of memory components is dissipated at least in part through a fin stack;
- accessing a reference temperature for controlling data transfer rate between a host and the set of memory components;
- comparing the measured temperature with the reference temperature; and
- adjusting the data transfer rate based on comparing the measured temperature with the reference temperature.

16. The method of claim 15, wherein the fin stack comprises a plurality of metal conductors, each of the plurality of metal conductors being coupled via a ground layer of a printed circuit board (PCB) to the at least one of the processing device or the set of memory components.

17. The method of claim 16, wherein each of the plurality of metal conductors extends vertically to a specified height relative to a base of the PCB on which the processing device and the set of memory components are implemented.

18. The method of claim 17, wherein each of the plurality of metal conductors extends horizontally a specified distance from the specified height parallel to the PCB.

19. A method of manufacturing a printed circuit board (PCB) comprising a memory system, the method comprising:
- placing a processing device on a first portion of the PCB;
- placing a set of memory components of the memory system on a second portion of the PCB;
- connecting a fin stack placed on a third portion of the PCB to a ground layer of the PCB, the fin stack configured to dissipate heat from the processing device and the set of memory components; and
- coupling the processing device and the set of memory components through the ground layer of the PCB to the fin stack.

20. The method of claim 19, comprising:
- placing a conductor of the fin stack in a via of the PCB; and
- bending a top portion of the conductor that extends vertically a specified distance from a base of the PCB.

* * * * *